United States Patent
Bucelot et al.

(10) Patent No.: US 9,634,654 B2
(45) Date of Patent: Apr. 25, 2017

(54) SEQUENCED PULSE-WIDTH ADJUSTMENT IN A RESONANT CLOCKING CIRCUIT

(71) Applicant: INTERNATIONAL BUSINESS MACHINES CORPORATION, Armonk, NY (US)

(72) Inventors: Thomas J. Bucelot, Wappingers Falls, NY (US); Phillip J. Restle, Katonah, NY (US); David Wen-Hao Shan, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/820,726

(22) Filed: Aug. 7, 2015

(65) Prior Publication Data
US 2017/0040987 A1 Feb. 9, 2017

(51) Int. Cl.
*G06F 1/10* (2006.01)
*H03K 3/00* (2006.01)
*H03K 7/08* (2006.01)

(52) U.S. Cl.
CPC ....... *H03K 7/08* (2013.01); *G06F 1/10* (2013.01)

(58) Field of Classification Search
CPC ..... G06F 1/10; G06F 1/06; G06F 1/04; G11C 7/22
USPC ................. 327/291, 295, 108, 112
See application file for complete search history.

(56) References Cited

U.S. PATENT DOCUMENTS

| | | |
|---|---|---|
| 5,559,478 A | 9/1996 | Athas et al. |
| 6,983,394 B1 | 1/2006 | Morrison et al. |
| 7,015,765 B2 | 3/2006 | Shepard et al. |
| 7,145,408 B2 | 12/2006 | Shepard et al. |
| 7,206,343 B2 | 4/2007 | Pearce |
| 7,237,217 B2 | 6/2007 | Restle |
| 7,286,947 B1 | 10/2007 | Cranford, Jr. et al. |
| 7,400,555 B2 | 7/2008 | Franch et al. |
| 7,571,410 B2 | 8/2009 | Restle |
| 7,719,316 B2 | 5/2010 | Chueh et al. |
| 7,719,317 B2 | 5/2010 | Chueh et al. |
| 7,742,388 B2 | 6/2010 | Shearer et al. |

(Continued)

OTHER PUBLICATIONS

U.S. Appl. No. 15/040,423, filed Feb. 10, 2016, Franch, et al.
(Continued)

*Primary Examiner* — Quan Tra
(74) *Attorney, Agent, or Firm* — Mitch Harris, Atty at Law, LLC; Andrew M. Harris; Steven L. Bennett

(57) ABSTRACT

A clock driver control scheme for a resonant clock distribution network provides robust operation by controlling a pulse width of the output of clock driver circuits that drive the resonant clock distribution network so that changes are sequenced. The clock driver control circuit controls the clock driver circuits in the corresponding sector according to a selected operating mode via a plurality of control signals provided to corresponding clock driver circuits. The pulse widths differ for at least some of the sectors during operation of digital circuits within the integrated circuit having clock inputs coupled to the resonant clock distribution network. The different pulse widths may be a transient difference that is imposed in response to a mode or frequency change of the global clock that provides an input to the clock driver circuits.

11 Claims, 7 Drawing Sheets

(56) References Cited

U.S. PATENT DOCUMENTS

| | | |
|---|---|---|
| 7,872,539 B1 | 1/2011 | Athas |
| 7,880,551 B2 | 2/2011 | Chan et al. |
| 7,944,229 B2 | 5/2011 | Joshi et al. |
| 7,956,664 B2 | 6/2011 | Chueh et al. |
| 7,961,559 B2 | 6/2011 | Dixon et al. |
| 8,289,063 B2 | 10/2012 | Chueh et al. |
| 8,339,209 B2 | 12/2012 | Papaefthymiou et al. |
| 8,358,163 B2 | 1/2013 | Papaefthymiou et al. |
| 8,362,811 B2 | 1/2013 | Papaefthymiou et al. |
| 8,368,450 B2 | 2/2013 | Papaefthymiou et al. |
| 8,400,192 B2 | 3/2013 | Papaefthymiou et al. |
| 8,461,873 B2 | 6/2013 | Ishii et al. |
| 8,466,739 B2 | 6/2013 | Kim et al. |
| 8,502,569 B2 | 8/2013 | Papaefthymiou et al. |
| 8,576,000 B2 | 11/2013 | Kim et al. |
| 8,593,183 B2 | 11/2013 | Papaefthymiou et al. |
| 8,611,379 B2 | 12/2013 | Raghavan et al. |
| 8,659,338 B2 | 2/2014 | Papaefthymiou et al. |
| 8,704,576 B1 | 4/2014 | Bucelot et al. |
| 8,729,975 B2 | 5/2014 | Van Goor et al. |
| 8,736,342 B1 | 5/2014 | Bucelot et al. |
| 8,847,652 B2 | 9/2014 | Chern et al. |
| 8,854,100 B2 | 10/2014 | Sathe et al. |
| 9,054,682 B2 | 6/2015 | Bucelot et al. |
| 9,058,130 B2 | 6/2015 | Bucelot et al. |
| 9,116,204 B2 | 8/2015 | O'Mahony et al. |
| 2002/0057126 A1 | 5/2002 | Hsu et al. |
| 2002/0130699 A1 | 9/2002 | Zimlich |
| 2003/0189451 A1 | 10/2003 | Ziesler et al. |
| 2003/0191977 A1 | 10/2003 | Ziesler et al. |
| 2003/0201803 A1 | 10/2003 | Kim et al. |
| 2006/0082387 A1 | 4/2006 | Papaefthymiou et al. |
| 2006/0171223 A1 | 8/2006 | Kim |
| 2007/0096957 A1 | 5/2007 | Papaefthymiou et al. |
| 2008/0150605 A1 | 6/2008 | Chueh et al. |
| 2008/0303552 A1 | 12/2008 | Chueh et al. |
| 2008/0303576 A1 | 12/2008 | Chueh et al. |
| 2009/0027085 A1 | 1/2009 | Ishii et al. |
| 2011/0084736 A1 | 4/2011 | Papaefthymiou et al. |
| 2011/0084772 A1 | 4/2011 | Papaefthymiou et al. |
| 2011/0084773 A1 | 4/2011 | Papaefthymiou et al. |
| 2011/0084774 A1 | 4/2011 | Papaefthymiou et al. |
| 2011/0084775 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |
| 2011/0095802 A1 | 4/2011 | Horikoshi et al. |
| 2011/0140753 A1 | 6/2011 | Papaefthymiou et al. |
| 2011/0210761 A1 | 9/2011 | Ishii et al. |
| 2011/0215854 A1 | 9/2011 | Chueh et al. |
| 2011/0216604 A1 | 9/2011 | Mikajiri et al. |
| 2011/0260781 A1 | 10/2011 | Takeuchi et al. |
| 2012/0044958 A1 | 2/2012 | Raghavan et al. |
| 2013/0049826 A1* | 2/2013 | Kim .................. H03L 7/00 327/141 |
| 2013/0194018 A1 | 8/2013 | Papaefthymiou et al. |
| 2013/0328608 A1 | 12/2013 | Papaefthymiou et al. |
| 2014/0002175 A1 | 1/2014 | Papaefthymiou et al. |
| 2014/0002204 A1 | 1/2014 | Kim et al. |
| 2014/0015585 A1 | 1/2014 | Papaefthymiou et al. |
| 2014/0028407 A1 | 1/2014 | Chern et al. |
| 2014/0035649 A1 | 2/2014 | Nedovic |
| 2014/0062562 A1 | 3/2014 | Sathe et al. |
| 2014/0062565 A1 | 3/2014 | Sathe et al. |
| 2014/0062566 A1 | 3/2014 | Sathe et al. |
| 2014/0079169 A1 | 3/2014 | Raghavan et al. |
| 2014/0167832 A1 | 6/2014 | Bucelot et al. |
| 2014/0167868 A1 | 6/2014 | Guthaus |
| 2014/0240021 A1 | 8/2014 | Hibbeler et al. |
| 2014/0317389 A1 | 10/2014 | Wenisch et al. |
| 2015/0002204 A1 | 1/2015 | Aipperspach et al. |

OTHER PUBLICATIONS

List of IBM Patents or Patent Applications Treated as Related, 2 pages.
U.S. Appl. No. 14/303,671, filed Jun. 13, 2014, Bansal, et al.
U.S. Appl. No. 14/814,780, filed Jul. 31, 2015, Bucelot, et al.
U.S. Appl. No. 14/828,841, filed Aug. 18, 2015, Bucelot, et al.
U.S. Appl. No. 14/828,898, filed Aug. 18, 2015, Bucelot, et al.
Jain, et al., "On-Chip Delay Measurement Circuit", 2012 17$^{th}$ IEEE European Test Symposium, May 28-31, 2012, 6 pages (pp. 1-6 in pdf), IEEE Computer Society, Annecy, France.
Chan, et al., "Design of Resonant Global Clock Distributions" Proceedings of the 21$^{st}$ International Conference on Computer Design, ICCD '03, Oct. 13-15, 2003, 6 pages(pp. 1-6 in pdf), IEEE Computer Society, San Jose, CA, US.
Chan, et al., "A 4.6GHz Resonant Global Clock Distribution Network", 2004 IEEE International Solid-State Circuits Conference, Feb. 18, 2004, 8 pages (pp. 1-8 in pdf), IEEE, San Francisco, CA, US.
Chan, et al., "Uniform-Phase Uniform-Amplitude Resonant-Load Global Clock Distributions", IEEE Journal of Solid-State Circuits, Jan. 2005, pp. 102-109, vol. 40, No. 1, IEEE, US.
Sathe, et al., Resonant-Clock Latch-Based Design, IEEE Journal of Solid-State Circuits, Apr. 2008, pp. 864-873, vol. 43, No. 4, IEEE, US.
Chan, et al., "A Resonant Global Clock Distribution for the Cell Broadband Engine Processor", IEEE Journal of Solid-State Circuits, Jan. 2009, pp. 64-72, vol. 44, No. 1, IEEE, US.
Sathe, et al., "Resonant-Clock Design for a Power-Efficient, High-Volume x86-64 Microprocessor", IEEE Journal of Solid-State Circuits, Jan. 2013, pp. 140-149, vol. 48, No. 1, IEEE, US.
Restle, et al., "Wide-Frequency-Range Resonant Clock with On-the-Fly Mode Changing for the POWER8 Microprocessor", 2014 IEEE International Solid-State Circuits Conference, Feb. 10, 2014, 3 pages (pp. 1-3 in pdf), IEEE, San Francisco, CA, US.
Chan, et al., "A Resonant Global Clock Distribution for the Cell Broadband-Engine Processor", 2008 IEEE International Solid-State Circuits Conference, Session 28, Feb. 6, 2008, 3 pages (pp. 1-3 in pdf), IEEE, San Francisco, CA, US.
Franch, et al., "On-chip timing uncertainty measurements on IBM microprocessors" IEEE International Test Conference, Oct. 2007, paper 1.1, pp. 1-7, Santa Clara, CA, US.
Amrutur, et al., "0.84 ps Resolution Clock Skew Measurement via Subsampling", IEEE Transactions on Very Large Scale Integration (VLSI) Systems, Dec. 2011, pp. 2297-2275, vol. 19, No. 12, IEEE, US.
U.S. Appl. No. 14/882,668, filed Oct. 14, 2015, Franch, et al.
List of IBM Patents or Patent Applications Treated as Related, 1 page.
Office Action in U.S. Appl. No. 14/828,841 mailed on Aug. 25, 2016, 15 pages (pp. 1-15 in pdf).

* cited by examiner

SEQUENCED PULSE-WIDTH ADJUSTMENT IN A RESONANT CLOCKING CIRCUIT

BACKGROUND OF THE INVENTION

1. Field of the Invention

The present invention is related to integrated circuits incorporating resonant clocking schemes, and more specifically to techniques for controlling pulse widths of resonant clocking drive circuits during operation.

2. Description of Related Art

Resonant clocking of digital integrated circuits provides low energy consumption and well-controlled clock characteristics, including reduction of jitter and predictable point-to-point delay. In some implementations, a reduced pulse width is employed in resonant clock drivers to further decrease energy consumption, since the clock driver only needs to be active long enough to restore the energy that is lost in the portions (sectors) of the resonant clock distribution network that is being driven by the individual clock drivers.

Mode changing in a resonant clock distribution network is needed for variable operating frequency, for example, in a processor integrated circuit with "turbo" operating modes or in which voltage-frequency scaling is employed to reduce energy consumption when processor activity is low. The mode changing may change operating frequency and/or may change the clock mode from resonant distribution to non-resonant, while adjusting the drive pulse width. However, when changing the pulse width in a resonant clock distribution network, the latency of the clock signals changes. Such changes generate timing errors that may cause improper operation of the integrated circuit in which the resonant clock distribution network is implemented.

It would therefore be desirable to provide a control scheme for a resonant clocking circuit that can change drive pulse width during operation without causing clock glitches.

BRIEF SUMMARY OF THE INVENTION

The invention is embodied in a resonant clock driver control circuit that provides for drive pulse width changes during operation.

The circuit is a clock driver control circuit for a resonant clock distribution network that generates signals to select a pulse width of the output of clock driver circuits that drive the resonant clock distribution network to generate a distributed clock signal according to a selected operating mode. The clock driver control circuit controls the clock driver circuits in the corresponding sector to set the pulse width according to a plurality of control signals provided to corresponding ones of the plurality of clock driver circuits. The pulse width differs for at least some of the sectors during operation of digital circuits within the integrated circuit having clock inputs coupled to the resonant clock distribution network. The different pulse width may be a transient difference that is imposed in response to a mode or frequency change of the global clock that provides an input to the clock driver circuits.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to digital integrated circuits containing resonant clock distribution networks, such as memory devices, processors and other circuits in which variable frequency and low power operation are desirable. The resonant clocking circuits disclosed herein include high-efficiency pulse-driven circuits that have selectable pulse widths corresponding to the different operating modes of the resonant clock distribution network. The clocking circuits include a delay line that controls the pulse widths that respond to one or more mode control signals so that a pulse width of the sector buffer outputs are changed without generating glitches or otherwise disrupting operation. In particular, when selecting a new resonant clocking mode, the mode change causes changes in latency. When changing to resonant mode from non-resonant mode, or when changing from a lower-frequency resonant mode to a higher-frequency operating mode, short cycles can be generated due to "cycle compression", i.e., the sudden change from one cycle time to another. Unless additional timing margins are included in the connected circuits to accommodate short cycles due to cycle compression, the circuits connected to the clocking circuits may fail to operate properly. The typical solution for avoiding cycle compression is to change the mode slowly, e.g., by reducing pulse width gradually. However, the gradual reduction of the resonant clocking characteristics reduces the rate at which mode changes can be made and also reduces overall performance by not increasing clock frequency as quickly as possible without such constraints and/or increases energy consumption by not reducing pulse width as quickly as possible. The circuits and methodologies disclosed herein reduce the impact of short cycle generation due to mode changes by sequencing the pulse width changes for different sectors at different times, which reduces the degree to which short cycles are generated.

Figure 1:
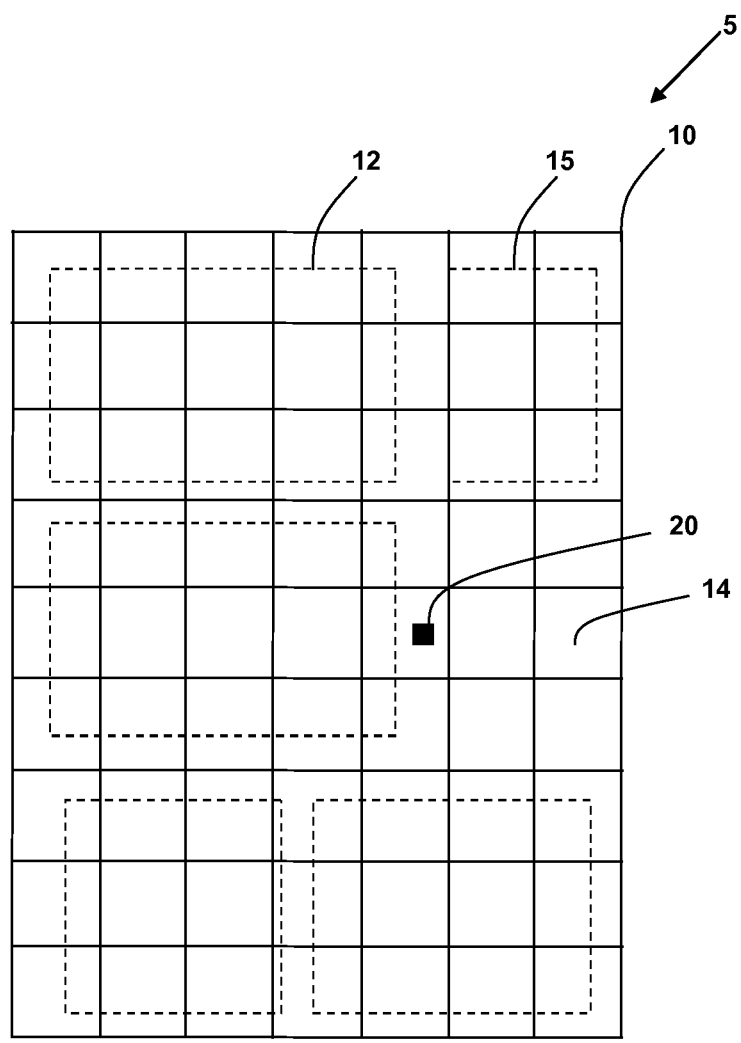
FIG. 1 is a block diagram illustrating an exemplary integrated circuit 5 having a resonant clock distribution grid 10.

With reference now to the figures, and in particular with reference to FIG. 1, an exemplary integrated circuit (IC) 5 is shown, which may represent a processor integrated circuit, a memory device, or another very-large scale integrated circuit (VLSI) that contains logic and storage. Within IC 5, a clock grid 10 provides a resonant clock distribution network. IC 5 includes a plurality of functional circuits 12, such as computation units, memories, caches, etc. and includes a power management unit (PMU) 15 that controls the clock frequency and power supply voltages within IC 5. Clock grid 10 is a metal layer grid that divides IC 5 into sectors 14, each of which includes a sector buffer 20 that locally drives clock grid 10 in accordance with a distributed global clock, generally provided by a phase-lock loop (PLL) within power PMU 15 that determines the operating frequency of IC 5. The PLL may be located separate from PMU 15, as well. Clock grid 10 is resonated at one of two or more selectable frequencies to distribute the global clock with low energy consumption and stable phase. Clock grid 10 may also be operated in a non-resonant condition, generally at a lowered frequency. A mode selection logic within PMU 15 provides mode selection, and in the instant disclosure, mode control signals that are distributed to each of sector buffers 20 so that the resonant (or non-resonant) frequency and a pulse width for the clock drivers can be selected by sector, or by another subdivision of clock grid 10.

Figure 2:
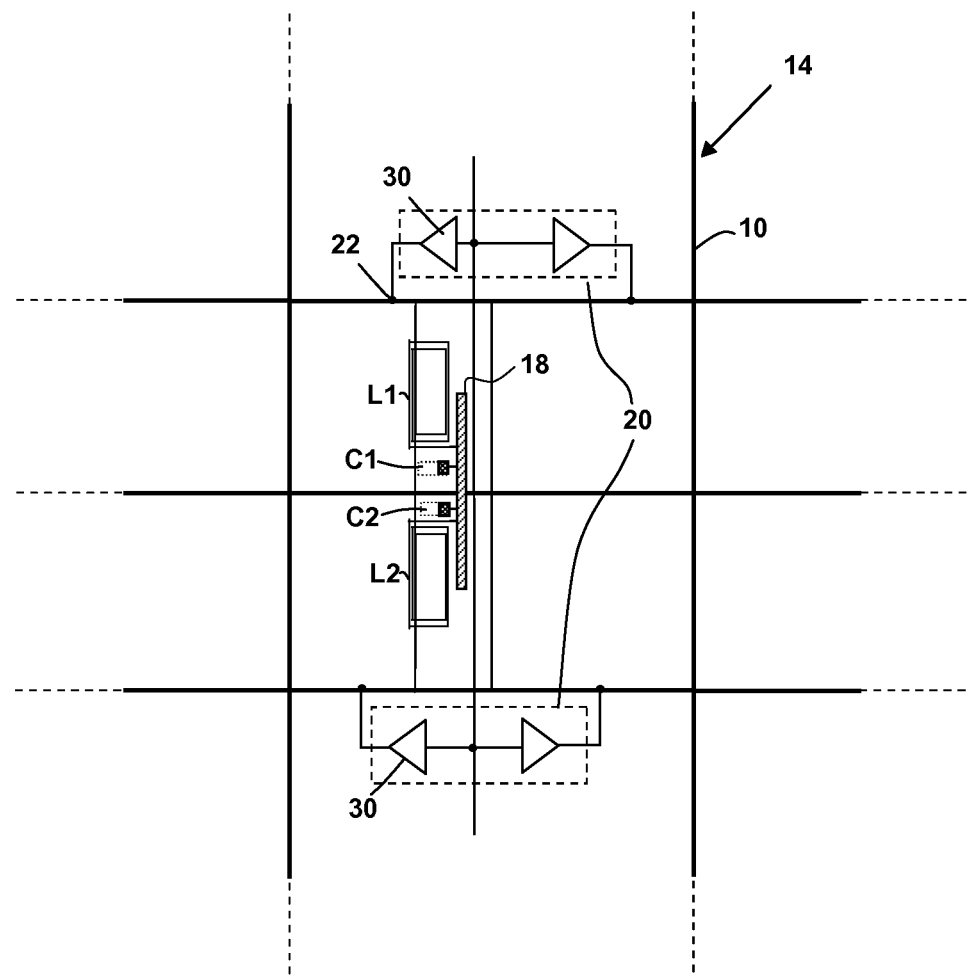
FIG. 2 is a simplified schematic diagram of a sector clock driver circuit 20 that may be used in resonant clock distribution grid 10 of FIG. 1.

Referring now to FIG. 2, details of example sector buffer 20 are shown. The depicted sector buffer 20 includes four clock drivers 30 that are connected to different drive points 22 of clock grid 10. In practice, each of clock drivers 30 will generally include a number of parallel drivers in order to reduce the output impedance of the final stage and that can be disabled or enabled to change the drive strength of the individual clock drivers 30 as shown in further detail below. Sector buffer 20 also includes inductors L1 and L2 and capacitors C1 and C2, which are selectively connected to clock grid 10 by a switching circuit 18 in order to change the resonant frequency of sector buffer 20, or to select non-resonant mode. By selecting the resonant frequency at each sector buffer 20 in IC 5, the frequency at which grid 5 resonates is changed. Sector buffer 20 is provided as an example of one type of sector buffer that supports multiple resonant frequencies and a non-resonant mode. However, the techniques disclosed herein apply to other types of sector buffers that use a single inductor with multiple tuning capacitors and other switching arrangements that provide for selection between modes.

Figure 3:
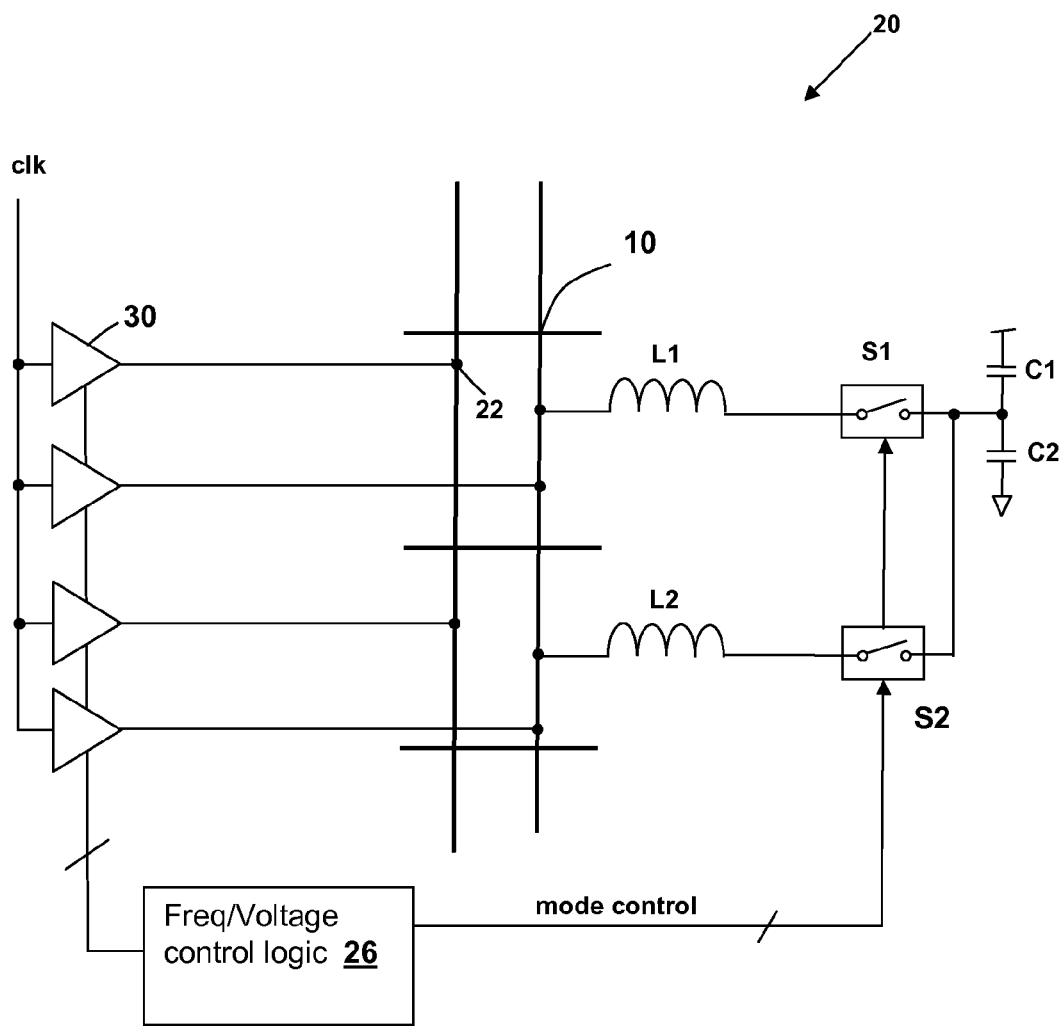
FIG. 3 is a schematic diagram of sector clock driver circuit 20 of FIG. 2.

Referring now to FIG. 3, further details of sector buffer 20 are shown. Switching circuit 18 includes switches S1 and S2, which are opened and closed to select different operating modes according to one or more mode control signals mode control provided from a frequency/voltage control logic 26 within PMU 15 of FIG. 1. If both switch S1 and S2 are open, then the resonant tank formed by one or both of inductors L1 and L2 and the parallel combination of capacitors C1 and C2 is broken and sector buffer 20 (and thus clock grid 10) will operate in non-resonant mode, and clock drivers 30 will drive a global clock waveform clk onto clock grid 10. If either or both of switches S1 and S2 are open, then the resonant tank formed by one or both of inductors L1 and L2 and the parallel combination of capacitors C1 and C2 is formed and sector buffer 20 (and thus clock grid 10) will operate in resonant mode. As long as global clock waveform clk has the appropriate frequency, i.e. within the resonant band of the tank formed by selected ones of inductors L1 and L2 and the parallel combination of capacitors C1 and C2, then clock drivers 30 will stimulate grid 10 to resonate at the frequency of global clock clk. In the instant disclosure, the pulse width of clock drivers 30 is also selected by mode control signals mode control to reduce energy consumption by clock drivers 30, so that only the required energy is transferred to grid 10. In non-resonant mode, the pulse width of clock drivers 30 is generally not reduced. Mode control signals mode control are made dynamically by frequency/voltage control logic 26 and the instant disclosure provides circuits and techniques by which changes in latency at the outputs of clock drivers 30 are reduced when changing clocking modes, i.e., when selecting between different operating frequencies and/or selecting between resonant and non-resonant operating modes.

Figure 4:
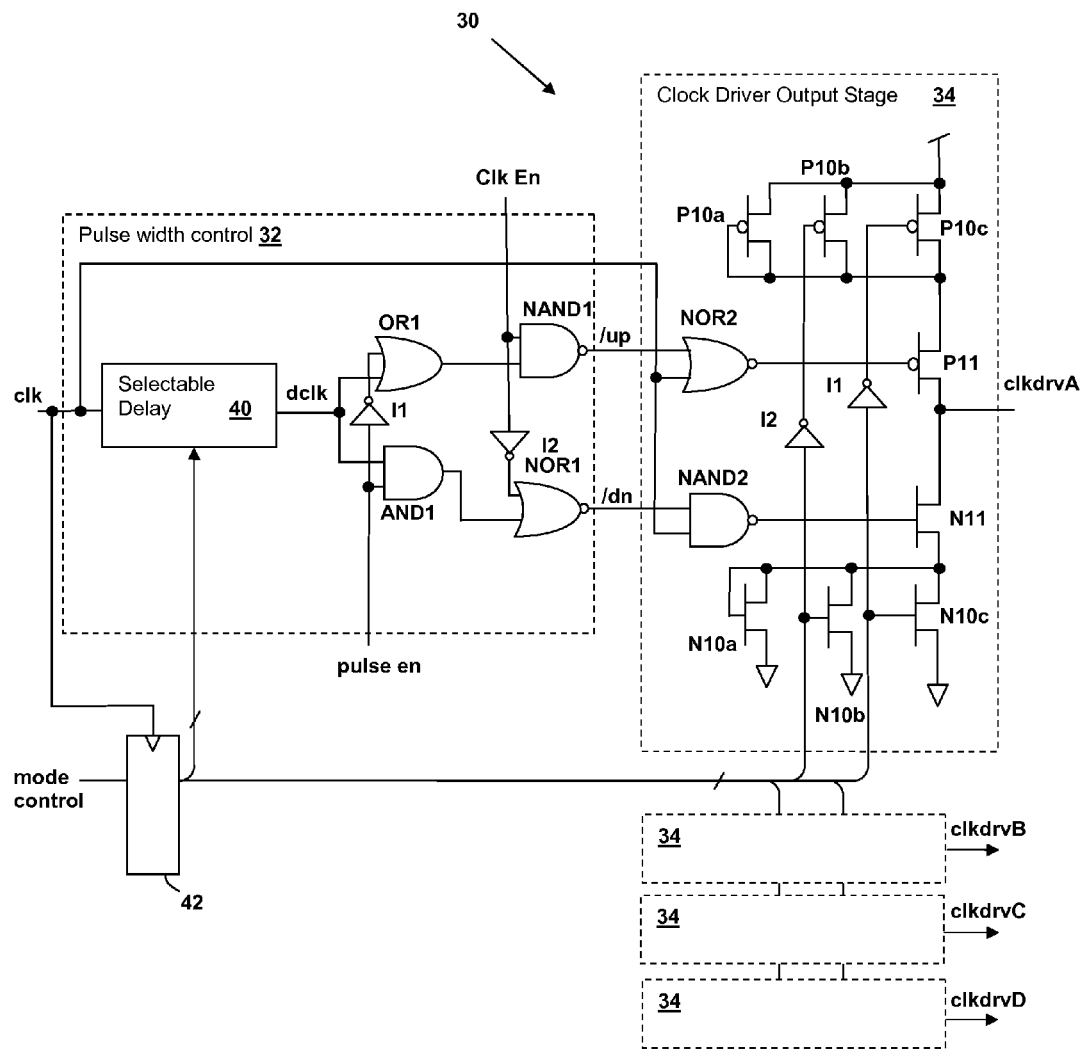
FIG. 4 is a schematic diagram of a clock buffer circuit 30 including a pulse width control circuit 32A according to a first example that may be used in the integrated circuit of FIG. 1.

Referring now to FIG. 4, details of a clock driver 30 according to a first example are shown. A clock driver output stage 34 includes a driver formed by transistors P11 and N11, which are generally of greater area than other transistors used to implement logic, or as mentioned above, a number of inverters may be connected in parallel to increase the drive strength of an output clkdrvA of clock driver 30. In the instant example, the drive strength of clock driver 30 is controlled by controlling the current or impedance between the power supply voltage rails and the drain terminals of transistors P11 and N11, but alternatively, separate buffers can be individually enabled or disabled and connected in parallel at the output of clock driver 30. The inverter formed by transistors P11 and N11 has power supply rails supplied to the drain terminals of transistors P11 and N11 from a pair of transistors N10a and P10a configured to provide a lower current level through transistors P11 and N11, and another two pairs of transistors N10b, P10b and N10c, P10c configured to provide selectable higher current levels in combination with transistors N10a and P10a, when different combinations of mode control signals mode control are asserted. A per-sector latch 42 is used to ensure that mode control signals mode control change for each sector at the designated time. Alternatively, latches can be provided for larger groups of sectors, or for individual clock buffers within a sector. In another alternative embodiment, the timing of the changes to mode control signals mode control for individual sectors and/or drivers can be controlled by wire lengths, buffer insertions or other asynchronous delay methods that ensure that mode control signals mode control change at controlled times according to the design scheme. Inverters I10 and I11 provide complementary control signals for controlling the gate terminals of transistors P10c and P10b, respectively. The resulting operation provides a lower drive strength from clock driver output stage 34 when corresponding ones of mode control signals mode control are de-asserted. Four different current levels are possible with the illustrated clock driver output stage 34, but in practice, any number of power supply rail current or impedance control devices can be used to provide more discrete control of drive strength.

The other three clock driver output stages 34 are identical to the illustrated clock drive output stage 34 and provide outputs clkdrvB, clkdrvC and clkdrvD for driving the other three drive points 22, as shown in FIG. 3. Clock driver output stage 34 also includes logic formed by a logical-NOR gate NOR2, an inverter I1, a logical-NAND gate NAND2 and an inverter I2, which receive global clock signal clk and control the pull-up and pull-down portions of the driver, i.e., transistors P11 and N11, respectively. A pulse width control circuit 32 provides pull-up and pull-down enable signals which, in turn, provide a pulse up, dn for each state of global clock signal clk that controls the duration of the pull-up and pull-down phase of outputs clkdrvA, clkdrvB, clkdrvC and clkdrvD. Illustrated pulse width control circuit 32 is a generalized example of a pulse width control circuit 32 that may be used to control clock drive output stages 34 so that glitches are not produced at the outputs clkdrvA, clkdrvB, clkdrvC and clkdrvD of control clock drive output stage 34. Details of various pulse width control circuits 32 that provide glitch-free operation are disclosed in U.S. patent application Ser. No. 14/814,780 filed on Jul. 31, 2015, by the same Applicant, and entitled "PULSE-DRIVE RESONANT CLOCK WITH ON-THE-FLY MODE CHANGE", the disclosure of which is incorporated herein by reference.

Pulse width control circuit 32 includes a selectable delay 40 that delays global clock signal clk to produce a delayed clock dclk and which is controlled according to mode control signals mode control so that the delay time of the selectable delay 40 is selected for the current operating mode. Particular sectors may have a delayed selection of the operating mode, or may have a different mode selected by mode control signals mode control for the particular sector, depending on drive strength needs, pulse width needs, and whether a change has just occurred in the operating mode. The output of selectable delay 40 is gated by a logic circuit composed of a logical-OR gate OR1, a logical-AND gate AND1, with an inverter I1 illustrated to provide a complement to a control signal Pulse En that enables pulse width control of clock drive output stage 34, so that, for example, pulse width control can be disabled when non-resonant clocking mode is selected. Another logic circuit is provided to enable and disable clocking entirely and is composed of logical-NAND gate NAND1, logical-NOR gate NOR1 with an inverter I2 illustrated to provide a complement to a control signal Clk En that enables clocking of clock drive output stage 34.

Figure 5:
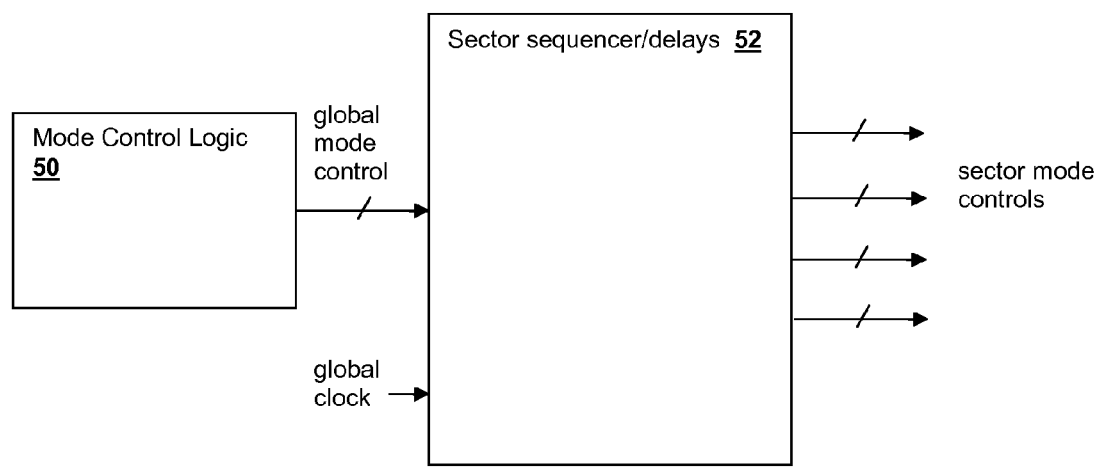
FIG. 5 is a schematic diagram of a control circuit for controlling sector clock buffers in the integrated circuit of FIG. 1.

Referring now to FIG. 5, a mode control circuit is shown. A mode control logic 50, which may be located in PMU 15, or elsewhere, generates a set of global mode control signals global mode control that are provided to a sector sequencer/delay circuit 52 that generates the mode control signals sector mode controls provided to individual sectors, groups of sectors, or in some embodiments, individual clock drivers within the sectors. Sequencer/delay circuit 52 may use counters operated by a global clock global clock, or may use delays that control when the individual mode control signals mode control for each division of grid 10 change state. By generating independent mode control signals mode control for each division of grid 10, e.g., per-sector, the pulse width can be sequenced when changing from one operating mode to another. For example, when switching from non-resonant mode to resonant mode, the pulse width will initially be 50% or 100% on or off time for each half of the cycle. To save energy in the resonant clocking mode, eventually the pulse width will be reduced to a low level, e.g., a level sufficient to maintain the resonant condition on grid 10. If the change is made immediately, the clock driver circuits may generate glitches, or in some cases cause erroneous operation. So, the pulse width of individual sectors' clock buffers 30 is controlled to gradually reduce the pulse width. In other embodiments, independent mode control signals mode control may be generated for each individual clock driver, so that pulse widths of clock drivers within individual sectors may differ, at least during mode transitions.

Figure 6:
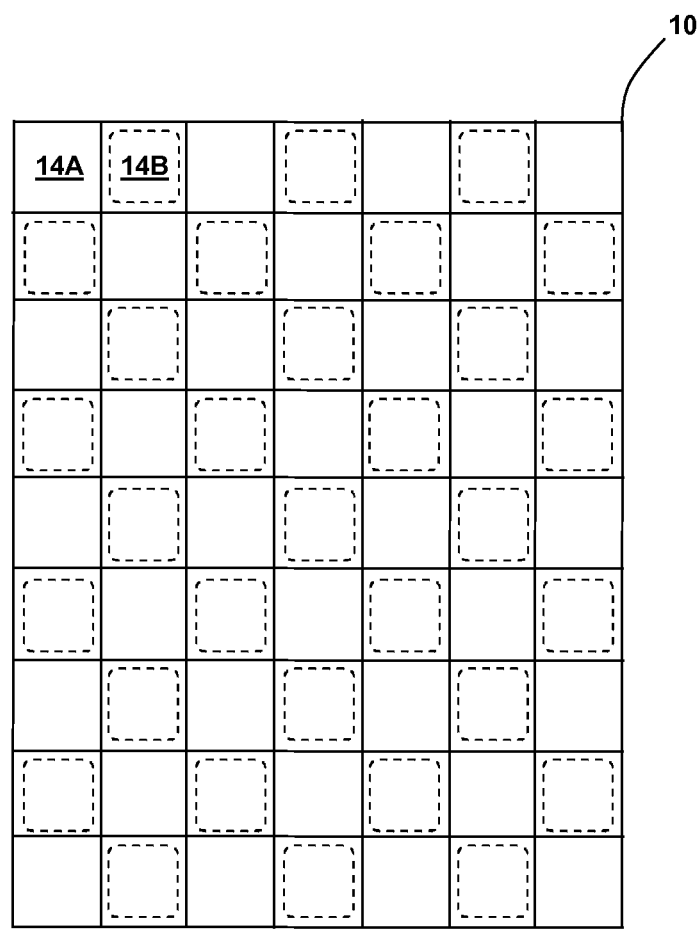
FIG. 6 is a pictorial diagram illustrating control of alternate sectors in resonant clock distribution grid 10 as may be implemented in the integrated circuit of FIG. 1.

Referring now to FIG. 6, one possible arrangement of the sequencing of clock driver pulse width is illustrated in grid 10. The sectors of grid 10 marked with dashed blocks form an alternating set of sectors that alternates by both row and column. A first set contains a sector 14A and a second set contains a sector 14B. Sectors 14A and 14B are adjacent, and in the illustrated control scheme, are controlled with separate mode control signals mode control. Sector 14A and all of the sectors not marked with dashed blocks are controlled by a first set of mode control signals in the example and the alternating sectors containing dashed blocks such as 14B are controlled by a second set of mode control signals. In the example, when a mode control change is made from non-pulsed operation to pulsed operation, the first set of mode control signals is changed to enable pulsed operation by asserting the mode control signals mode control corresponding to control signal pulse enable for the first set of sectors. That operation is asserted for a first time interval so that the operation of grid 10 is stabilized. In a next interval, the first set of mode control signals mode control corresponding to the pulse width, i.e., the delay of selectable delay 40 in the sector buffers for the first set of sectors and/or the mode control signals mode control corresponding to the pulse width selection for the sector buffers in the first set of sectors are set to the desired pulse width values, which may be the final values, or may represent an increment that is being applied on the second interval. Also at the second interval, the mode control signals for the second set of sector buffers are set to enable pulse width control corresponding to control signal pulse enable for the second set of sectors. When operation has stabilized in both sets of sectors, the pulse width is adjusted for the second set of sectors. As mentioned above, such adjustment can be performed in increments, or with just two alternations. Also, the "adjacent" arrangement illustrated in FIG. 6 may be changed to every three sectors, every four sectors, etc., and the alternation may be by both rows and columns as shown, or the alternation may be within rows or columns only, or another pattern that may be dynamically varied by sector sequencer/delays 52.

Figure 7:
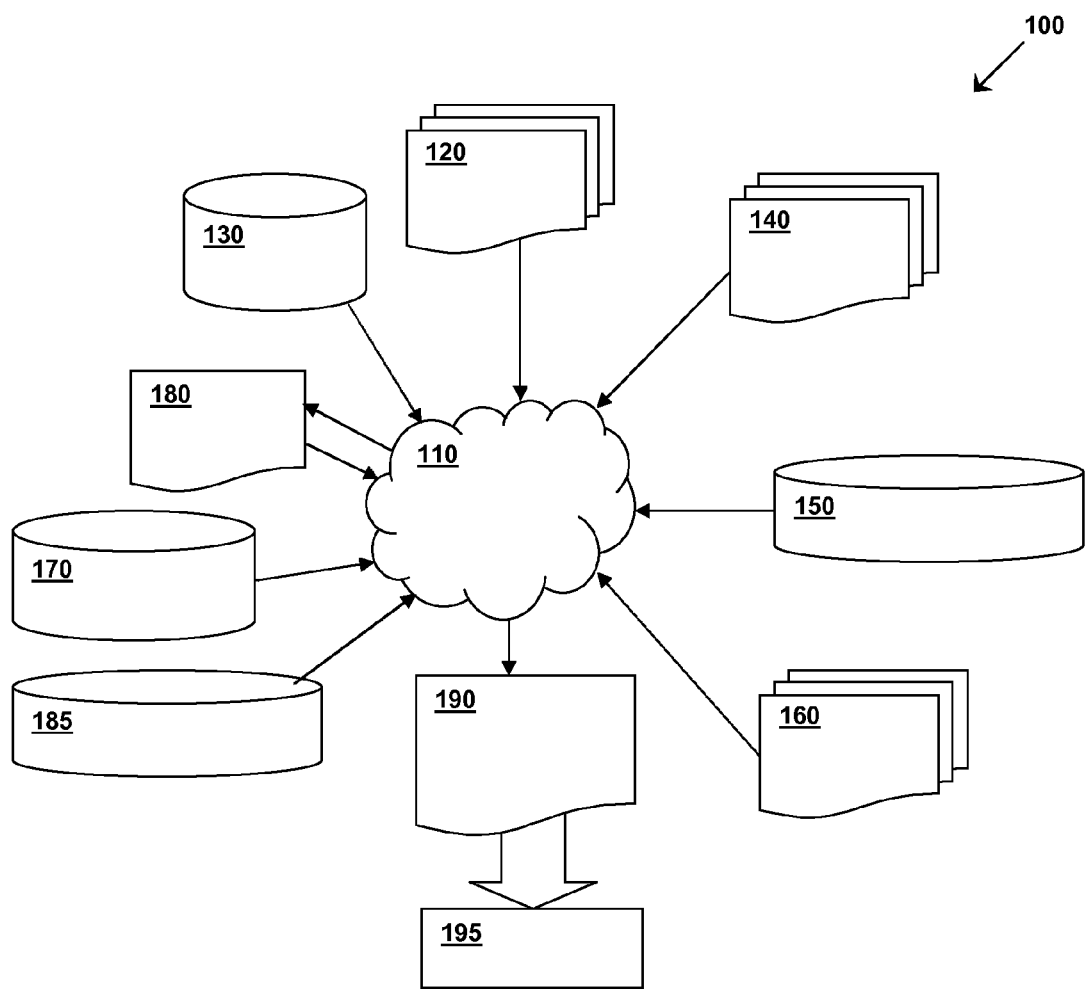
FIG. 7 is a flow diagram of a design process that can be used to fabricate, manufacture and test the integrated circuit of FIG. 1.

FIG. 7 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera Inc. or Xilinx, Inc.

FIG. 7 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1-5. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1-5 to generate a Netlist 180 which may contain design structures such as input design structure 120. Netlist 180 may comprise, for example, compiled or otherwise processed data structures representing a list of wires, discrete components, logic gates, control circuits, devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc.

Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 190 may comprise a compiled, executable HDL simulation model that functionally simulates the devices shown in FIGS. 1-5.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 190 may then proceed to a stage 195 where, for example, design structure 190: proceeds to tape-out, is released to manufacturing, is released to a mask house, is sent to another design house, is sent back to the customer, etc.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An integrated circuit including a resonant clock distribution network, comprising:
   a plurality of clock driver circuits having outputs for driving drive points of sectors of the resonant clock distribution network and having a clock input coupled to a global clock signal, wherein the clock driver circuits include pulse width controls responsive to a pulse width control input;

a clock driver control circuit that controls pulse widths of individual ones of the plurality of clock drivers according to a plurality of control signals provided to the pulse width control inputs of corresponding ones of the plurality of clock driver circuits, wherein the pulse widths of the individual clock drivers differ for at least some of the sectors during operation of digital circuits within the integrated circuit having clock inputs coupled to the resonant clock distribution network;

first control logic for selecting an operating mode or a frequency of the resonant clock distribution network; and second control logic for generating the plurality of control signals such that, responsive to the selecting having selected a new operating mode or a new frequency, the pulse widths of the individual clock driver circuits are set to first pulse width values for a predetermined interval after the selecting selects the new operating mode or the new frequency, and wherein the pulse widths of the individual clock driver circuits are set to second pulse width values that differ from the first pulse width values after the predetermined interval has expired, wherein the individual clock driver circuits are operated at the first pulse width values during the predetermined interval and operated at the second pulse width values after the predetermined interval and until the first control logic again changes the operating mode or the frequency of the resonant clock distribution network.

2. The integrated circuit of claim 1, wherein the resonant clock distribution network comprises a metal layer conductive grid forming the sectors, and wherein the second control logic further sequences the pulse widths of the individual clock driver circuits during the predetermined interval after the first control logic selects the new operating mode or frequency, so that clock driver circuits in alternating sectors along rows or columns of the grid have a same pulse width, while clock driver circuits in adjacent sectors have the differing pulse width.

3. The integrated circuit of claim 2, wherein the first control logic changes the operating mode from a first pulsed clocking mode having a first pulse width to a second pulsed clocking mode having a second pulse width and wherein the second control logic further controls pulse width of individual ones of the plurality of clock driver circuits by changing a pulse width of the clock driver circuits in the alternating sectors before changing the pulse width of the clock driver circuits in the adjacent sectors.

4. The integrated circuit of claim 2, wherein the first control logic changes the operating mode from a non-pulsed clocking mode to a pulsed clocking mode, and wherein the second control logic further controls the pulse width of individual ones of the plurality of clock driver circuits by increasing an average pulse width of the plurality of clock driver circuits during the predetermined interval, whereby the pulse width of the plurality of clock driver circuits is decreased gradually to reach a predetermined pulse width for the selected pulsed operating mode.

5. The integrated circuit of claim 4, wherein the second control logic controls the pulse width of the plurality of clock driver circuits so that a first set of the plurality of clock driver circuits corresponding to the alternating sectors along rows or columns is enabled to pulse in response to the selected pulsed clocking mode with a maximum pulse width during a first portion of the predetermined interval and wherein a second set of the plurality of clock driver circuits remains in non-pulsed clocking mode, and wherein during a second portion of the predetermined interval subsequent to the first predetermined interval, the second set of the plurality of clock driver circuits corresponding to sectors other than the first set of clock driver circuits is enabled and the first set of driver circuits is set to a reduced pulse width.

6. The integrated circuit of claim 1, wherein the second control logic controls the pulse width of individual ones of the plurality of clock driver circuits, so that the pulse widths of clock driver circuits in a same sector may differ.

7. A resonant clock distribution network, comprising:
a conductive grid comprising sectors;
a plurality of clock driver circuits having outputs for driving drive points of sectors of the resonant clock distribution network and having a clock input coupled to a global clock signal, wherein the clock driver circuits include a pulse width control responsive to a pulse width control input;
a clock driver control circuit that controls the pulse width of individual ones of the plurality of clock drivers according to a plurality of control signals provided to the pulse width control input of corresponding ones of the plurality of clock driver circuits, wherein the pulse widths of the individual clock drivers differ for at least some of the sectors during operation of digital circuits within the integrated circuit having clock inputs coupled to the resonant clock distribution network;
first control logic for selecting an operating mode or frequency of the resonant clock distribution network; and
second control logic for generating the plurality of control signals such that, responsive to the selecting having selected a new operating mode or a new frequency, the pulse widths of the individual clock driver circuits are set to first pulse width values for a predetermined interval after the selecting selects the new operating mode or the new frequency, and wherein the pulse widths of the individual clock driver circuits are set to second pulse width values that differ from the first pulse width values after the predetermined interval has expired, wherein the individual clock driver circuits are operated at the first pulse width values during the predetermined interval and operated at the second pulse width values after the predetermined interval and until the first control logic again changes the operating mode or the frequency of the resonant clock distribution network.

8. The resonant clock distribution network of claim 7, wherein the second control logic further sequences the pulse widths of the individual clock driver circuits during the predetermined interval after the first control logic selects the new operating mode or frequency, so that clock driver circuits in alternating sectors along rows or columns of the grid have a same pulse width, while clock driver circuits in adjacent sectors have the differing pulse width.

9. The resonant clock distribution network of claim 8, wherein the first control logic changes the operating mode from a first pulsed clocking mode having a first pulse width to a second pulsed clocking mode having a second pulse width and wherein the second control logic further controls pulse width of individual ones of the plurality of clock driver circuits by changing a pulse width of the clock driver circuits in the alternating sectors before changing the pulse width of the clock driver circuits in the adjacent sectors.

10. The resonant clock distribution network of claim 8, wherein the first control logic changing changes the operating mode from a non-pulsed clocking mode to a pulsed clocking mode and wherein the second control logic further controls the pulse width of individual ones of the plurality of clock driver circuits by increasing an average pulse width of the plurality of clock driver circuits during the predetermined interval, whereby the pulse width of the plurality of clock driver circuits is decreased gradually to reach a predetermined pulse width for the selected pulsed operating mode.

11. The integrated circuit of claim 10, wherein the second control logic controls the pulse width of the plurality of clock driver circuits so that a first set of the plurality of clock driver circuits corresponding to the alternating sectors along rows or columns is enabled to pulse in response to the selected pulsed clocking mode with a maximum pulse width during a first portion of the predetermined interval and wherein a second set of the plurality of clock driver circuits remains in non-pulsed clocking mode, and wherein during a second portion of the predetermined interval subsequent to the first predetermined interval, the second set of the plurality of clock driver circuits corresponding to sectors other than the first set of clock driver circuits is enabled and the first set of driver circuits is set to a reduced pulse width.

* * * * *